US011768439B2

(12) United States Patent
Hung et al.

(10) Patent No.: US 11,768,439 B2
(45) Date of Patent: Sep. 26, 2023

(54) SYSTEMS AND METHODS FOR A NARROW BAND HIGH TRANSMITTANCE INTERFERENCE FILTER

(71) Applicant: Taiwan Semiconductor Manufacturing Co., Ltd., Hsinchu (TW)

(72) Inventors: Wolf Hung, Hsinchu (TW); Chung-Nan Chen, Hsinchu County (TW); Hong-Hsing Chou, Hsinchu County (TW); Chao-Li Shih, Hsinchu County (TW); Yeh-Chieh Wang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 25 days.

(21) Appl. No.: 17/403,540

(22) Filed: Aug. 16, 2021

(65) Prior Publication Data

US 2021/0373442 A1    Dec. 2, 2021

Related U.S. Application Data

(62) Division of application No. 15/830,746, filed on Dec. 4, 2017, now Pat. No. 11,092,898, which is a division of application No. 13/929,419, filed on Jun. 27, 2013, now Pat. No. 9,835,952.

(60) Provisional application No. 61/785,488, filed on Mar. 14, 2013.

(51) Int. Cl.
*G02B 5/28* (2006.01)
*G03F 7/00* (2006.01)

(52) U.S. Cl.
CPC ......... *G03F 7/70191* (2013.01); *G02B 5/283* (2013.01); *G02B 5/285* (2013.01); *G03F 7/70575* (2013.01)

(58) Field of Classification Search
CPC ..... C23C 16/486; C23C 14/221; G02B 5/285; G02B 5/283
See application file for complete search history.

(56) References Cited

U.S. PATENT DOCUMENTS

| | | | |
|---|---|---|---|
| 4,846,541 A | 7/1989 | Miura et al. | |
| 5,398,133 A * | 3/1995 | Tsai | G02B 5/281 359/359 |
| 5,621,500 A | 4/1997 | Shiraishi et al. | |
| 6,139,968 A | 10/2000 | Knapp et al. | |
| 6,525,806 B1 * | 2/2003 | Smith | G03F 7/70308 430/311 |
| 6,572,975 B2 | 6/2003 | Dalkaos | |

(Continued)

*Primary Examiner* — Elizabeth A Burkhart
(74) *Attorney, Agent, or Firm* — HAYNES AND BOONE, LLP (57) ABSTRACT

The present disclosure provides an interference filter, a lithography system incorporating an interference filter, and a method of fabricating an interference filter. The interference filter includes a transparent substrate having a front surface and a back surface, a plurality of alternating material layers formed over the front surface of the transparent substrate that form a bandpass filter, and an anti-reflective structure formed over the back surface of the transparent substrate. The alternating material layers alternate between a relatively high refractive index material and a relatively low refractive index material.

20 Claims, 5 Drawing Sheets

(56) References Cited

U.S. PATENT DOCUMENTS

| | | |
|---|---|---|
| 6,590,702 B1 | 7/2003 | Shirai |
| 7,119,960 B1 | 10/2006 | Erdogan et al. |
| 7,172,294 B2 | 2/2007 | Yano et al. |
| 8,264,752 B2 | 9/2012 | Katsuyama |
| 8,354,282 B2 | 1/2013 | Stern |
| 2008/0055716 A1 | 3/2008 | Erdogan et al. |
| 2014/0273459 A1 | 9/2014 | Hung et al. |

* cited by examiner

SYSTEMS AND METHODS FOR A NARROW BAND HIGH TRANSMITTANCE INTERFERENCE FILTER

The present application is a divisional application of U.S. patent application Ser. No. 15/830,746, filed Dec. 4, 2017, which is a divisional application of U.S. patent application Ser. No. 13/929,419, filed Jun. 27, 2013, which claims the benefit of U.S. Provisional Application No. 61/785,488 filed Mar. 14, 2013, entitled "Systems and Methods for a Narrow Band High Transmittance Interference Filter," each of which is incorporated herein by reference in its entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

The pursuit of smaller feature size has required a number of technological changes, including changes to lithography systems. Lithography systems include a light or radiation source that is filtered, directed, and focused in order to better transmit a pattern from a mask onto a wafer. One trend of recent years has been to adjust the wavelength of light used to expose semiconductor wafers. Another trend has been to use phase-shifting masks. However, despite these improvements in lithography systems, the current technology has not been entirely satisfactory.

BRIEF DESCRIPTION OF THE DRAWINGS

It is emphasized that, in accordance with the standard practice in the industry, various features are not drawn to scale. In fact, the dimensions of the various features may be arbitrarily increased or reduced for clarity of discussion.

Aspects of the figures in the present disclosure are best understood from the following detailed description when read in connection with the figures.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Further still, references to relative terms such as "front" and "back" are used to provide a relative relationship between elements and are not intended to imply any absolute direction. Various features may be arbitrarily drawn in different scales for simplicity and clarity.

Figure 1:
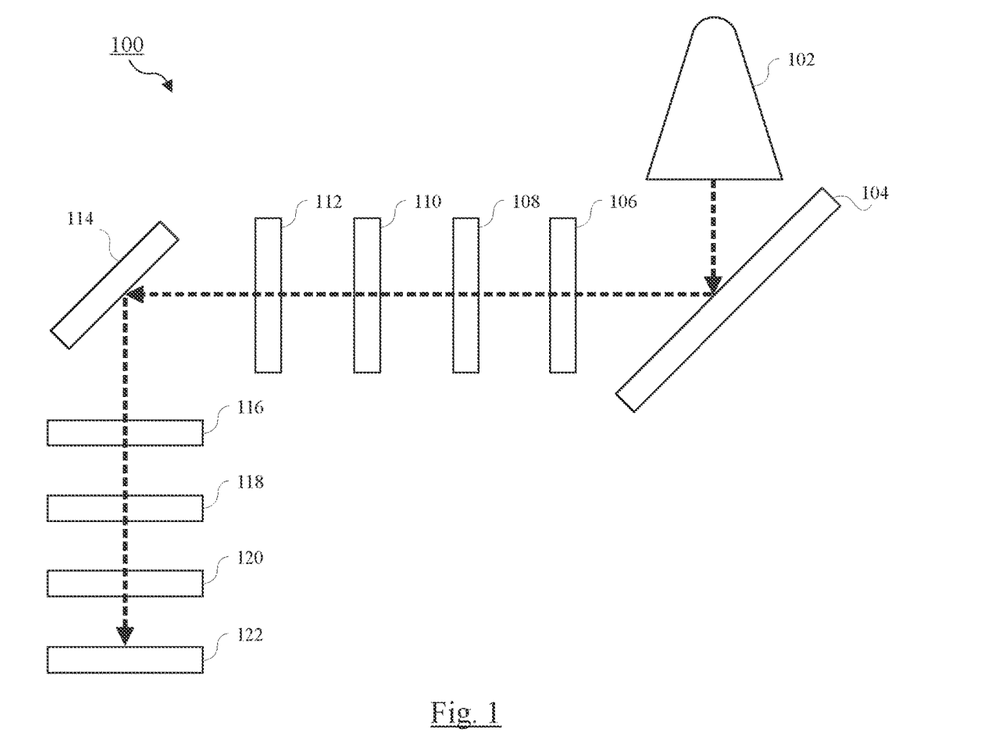
FIG. 1 is a diagram of a lithography system incorporating an interference filter according to an embodiment of the present disclosure.

FIG. 1 is a diagrammatic representation of a lithography tool or system 100 according to an embodiment. Lithography system 100 is simplified in a number of respects for clarity of explanation. Lithography system 100 includes a light source 102. Light source 102 serves as a source of light or radiation in photolithographic processes such as may be performed during semiconductor device fabrication. In the depicted embodiment, light source 102 is a mercury lamp, while in other embodiments light source may have a different type of lamp or source. The light generated by light source 102 travels a path illustrated in FIG. 1 by dashed-line arrows. To conserve space in a fabrication facility, the path of lithography system 100 may have a number of bends. These bands may be provided by mirrors, prisms, and/or other optic devices. The first bend occurs in the depicted light path when light from light source 102 encounters a first mirror 104. The first mirror 104 directs the light through a number of filters, lenses, and other optical devices. A first filter 106 may include a plurality of filters or may be a single filter. For example, first filter 106 may include an ultra-violet block filter and/or a WG filter. Lithography system 100 further includes a shutter unit 108 that may be used to selectively stop or permit the transmission of light to a target.

After the shutter unit 108 is an interference filter 110. In the depicted embodiment interference filter 110 includes a bandpass filter that permits a narrow band of wavelengths centered on or around a desired central wavelength to pass through the filter while rejecting other wavelengths. The lithography system 100 of FIG. 1 also includes an integrator block 112 before a second mirror 114, which causes another bend in the path of light coming from light source 102. Embodiments of lithography system 100 further include a gradient filter 116, a condenser lens 118, a reticle masking system 120, and a chuck 122 upon which a wafer to be exposed is positioned. Embodiments of lithography system 100 may contain a number of additional components not discussed above, such as a zoom lens, a field lens, an energy sensor, and a spot sensor, etc. These additional components may be apparent to one of skill in the art and are outside the scope of this disclosure. Furthermore, the components of lithography system 102 discussed above may be arranged in various sequences and a number of configurations that are within the scope of this disclosure.

Figure 2:
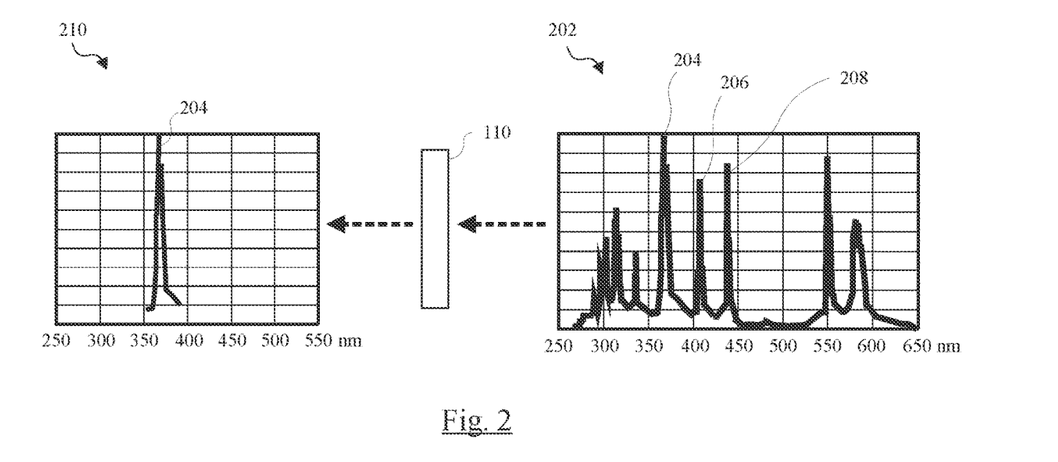
FIG. 2 is a diagram illustrating the effects of an interference filter on light coming from a source according to an embodiment of the present disclosure.

FIG. 2 illustrates the effects of interference filter 110 on the light received from light source 102. Light source 102 generates an unfiltered spectrum 202 of light having a plurality of peaks or lines depending on the type of light source used as light source 102. Several peaks or "lines" are depicted in the unfiltered spectrum 202 of FIG. 2, including i-line 204, h-line 206, and g-line 208. Each of these alphabetically designated lines represents a particular wavelength or small set of wavelengths provided by the spectrum of light source 102. In this example, i-line 204 is a peak around 370 nm, h-line 206 represents a peak around 405 nm, and g-line 208 is a peak around 440 nm.

It is desirable that interference filter 110 pass light in a narrow range of wavelengths, or have a narrow full wavelength of half maximum (FWHM), have a high transmission rate around a desired central wavelength, and a very low transmission rate away from the central wavelength. As depicted in FIG. 2, after light from light source 102 passes through interference filter 110, its filtered spectrum 210 is as depicted. Of note, i-line 204 is transmitted through interference filter 110, while h-line 206 and g-line 208 are blocked. While a peak transmission rate of interference filters may typically be around 80%, the peak transmission rate of interference filter 110 may be closer to 90 or 95%. As will be discussed in more detail below, interference filter 110 includes a transparent substrate with a plurality of material layers deposited on either surface of the transparent substrate. The plurality on a front side of interference filter 110 acts as a bandpass filter, while the plurality on the back side acts as an anti-reflective structure. Interference filter 110 may be orientated within lithography system 100 so that either the bandpass filter side of the anti-reflective structure side is closest to light source 102.

Figure 3A:
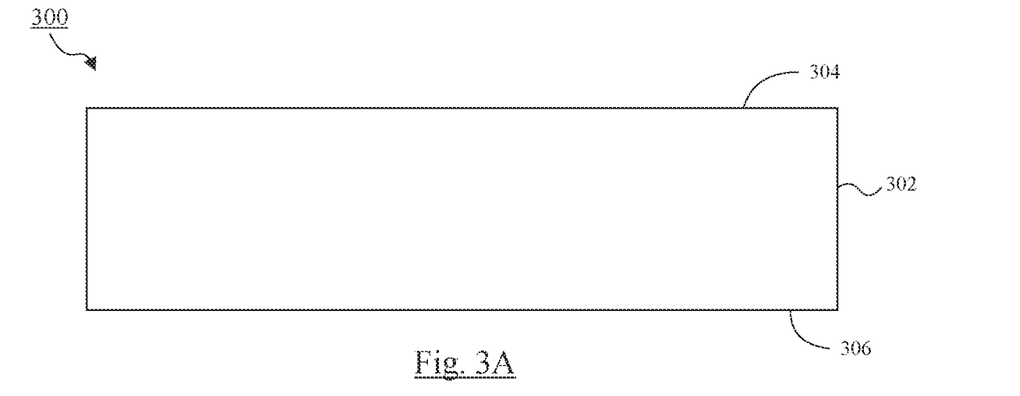
FIGS. 3A, 3B, 3C, 3D, and 3E are fragmentary cross-sectional views of the fabrication of an interference filter according to an embodiment of the present disclosure.

FIG. 3A depicts an interference filter 300 such as may be used as interference filter 110 of the lithography system 100 depicted in FIG. 1. Fabrication of interference filter 300 begins with a transparent substrate 302. The substrate 302 is transparent with respect to the light of the desired narrow range of light provided by an applied source such as light source 102. Thus, embodiments of substrate 302 may be transparent with respect to a given wavelength but not as transparent with respect to a different wavelength. As depicted, substrate 302 is a fused quartz substrate, with a first or front surface 304 and a second or back surface 306. Other materials may be used for the transparent substrate 302 in other embodiments. At this stage of fabrication, there may be no significant difference between front surface 304 and back surface 306. As depicted, substrate 302 has undergone one or more polishing steps or processes to improve both of surfaces 304 and 306.

Figure 3B:
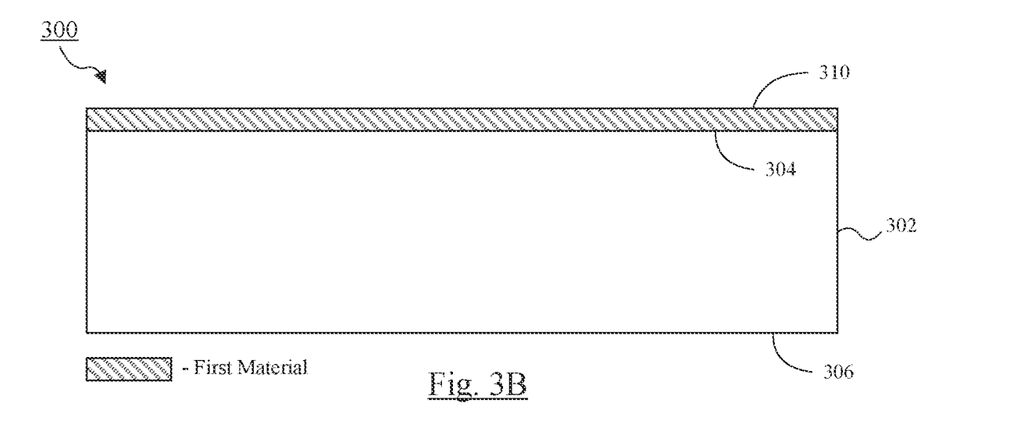

FIG. 3B further depicts a first material layer 310 over the front surface 304 of substrate 302. First material layer 310 is largely transparent with respect to the desired wavelength. Of particular importance, the first material layer 310 has a first refractive index, and is fabricated in such a way that the mathematical product of the first refractive index and a thickness of the first material layer 310 are equal to a quarter of the desired central wavelength to be passed by interference filter 300. In the depicted embodiment, the thickness is such that the product is equal to a quarter of the desired wavelength. Using a quarter wavelength allows the first material layer 310 to be thinner than if a half wavelength thickness were used.

A number of materials may be used for first material layer 310. As depicted, the first material layer 310 is formed from $MgF_2$ and has a refractive index of 1.38 and a film thickness of 66.12 nm. In this example, a desired wavelength or central wavelength of interference filter 300 is around 370 nm, i.e. 1.38×66.12 nm×4 equals around 370 nm. In other embodiments, first material layer 310 may be one of $TiO_2$, $Al_2O_3$, $Ta_2O_5$, and $SiO_2$, or another material. Example thicknesses and refractive indices for these materials is included in Table 1 below for a desired a central wavelength of around 370 nm.

TABLE 1

| Material | Refractive Index | Thickness (nm) |
|---|---|---|
| $MgF_2$ | 1.38 | 66.12 |
| $TiO_2$ | 2.35 | 38.83 |
| $Al_2O_3$ | 1.6 | 57.03 |
| $Ta_2O_5$ | 2.2 | 41.48 |
| $SiO_2$ | 1.47 | 62.07 |

First material layer 310 may be formed by a plurality of material deposition processes such as chemical vapor deposition, physical vapor deposition, atomic layer deposition, and other material deposition processes. In the depicted example, first material layer 310 is formed using a radiofrequency-driven ion beam assisted deposition process. First material layer 310 is formed so that it is an amorphous film layer, rather than a polycrystalline film layer. This may enhance resistance to environmental factors and reduce scattering of light transmitted through interference filter 300. In some embodiments, after first material layer 310 is deposited a polishing process may be performed. In some other embodiments, an annealing process may be performed.

Figure 3C:
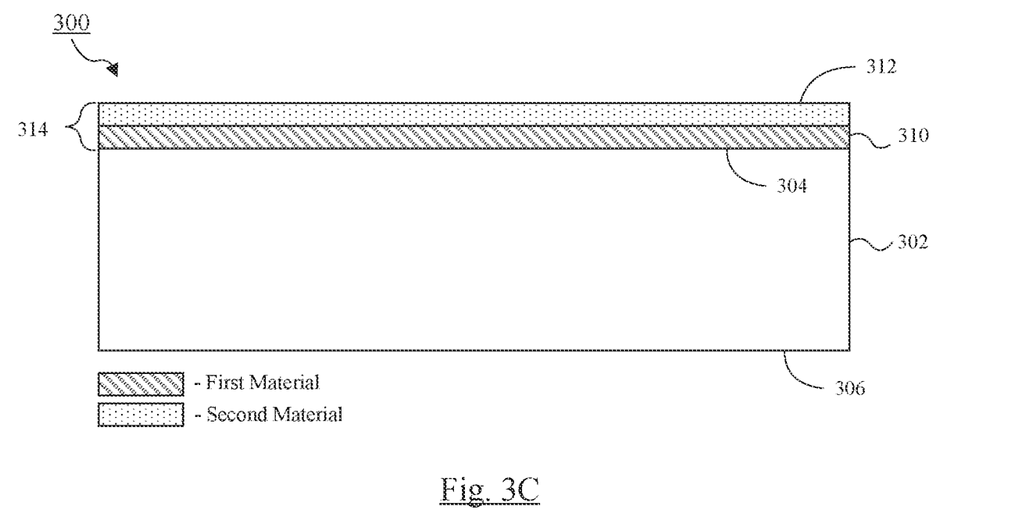

FIG. 3C is also a fragmentary cross-sectional diagram of interference filter 300 while in the process of fabrication. As depicted in FIG. 3C, a second material layer 312 is deposited over the first material layer 310. Similar techniques may be used in the deposition of second material layer 312 as those used in the deposition of first material layer 310. For example second material layer 312 may be deposited in an ion beam assisted deposition process. Second material layer 312 is formed from a different material than that used to form first material layer 310. The material of second material layer 312 and the material of first material layer 310 are selected such that one material has a relatively high refractive index while the other material has a relatively low refractive index.

Continuing the example in which the first material layer 310 is formed from $MgF_2$, second material layer 312 is formed from $TiO_2$, has a refractive index of 2.35, and is 38.83 nm thick. In this example, the refractive index of first material layer 310 (1.38) is relatively low compared to the refractive index of the second material layer 312 (2.35). It may be useful to think of first material layer 310 and second material layer 312 as a pair of layers 314.

Figure 3D:
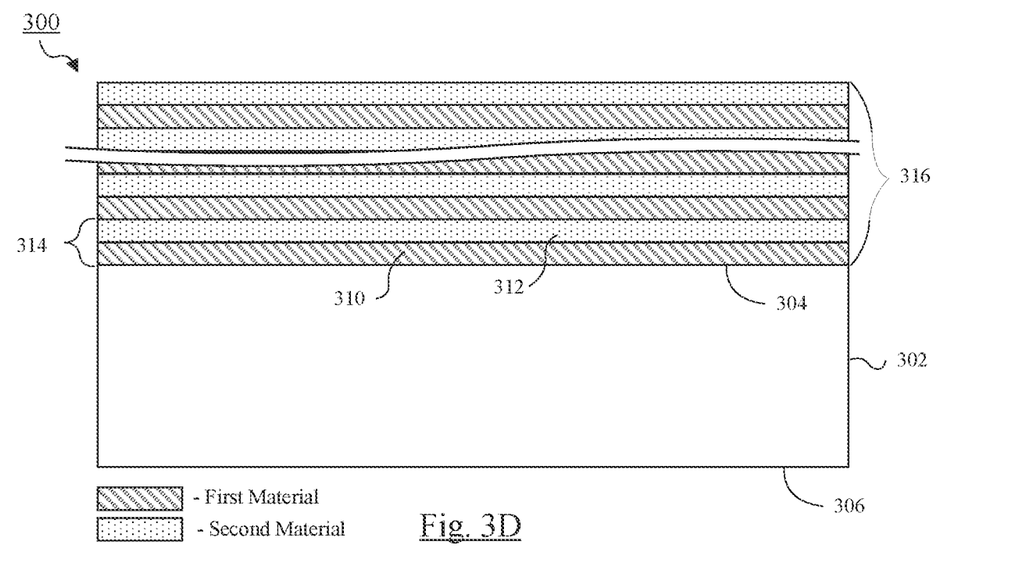

FIG. 3D depicts interference filter 300 with a plurality of pairs of layers 314 deposited on front surface 304 over substrate 302, in a low-high-low-high pattern. FIG. 3D explicitly depicts four such pairs of layers 314, but impliedly depicts many more. In general, front surface 304 has an even number of alternating material layers deposited over it. Embodiments of filter 300 may include a low number of material layers of about 20 layers to a high number of material layers at about 40 layers. In other words, front surface 304 may have from about 10 to about 20 pairs of layers to 14 deposited thereon. Some embodiments may have more or fewer. The plurality of alternating material layers deposited over front surface 204 forms a bandpass filter 316 that has a peak transmission at the desired wavelength, e.g. 370 nm. The depicted embodiment of interference filter 300 includes a bandpass filter 316 having a first material layer 310 formed from the relatively low refractive index material, and the second material layer 310 formed from the relatively high refractive index material. In some embodiments, first material layer 310 is formed from a relatively high refractive index material, and second material layer 312 is formed from a relatively low refractive index material as will be discussed in FIG. 4.

Figure 3E:
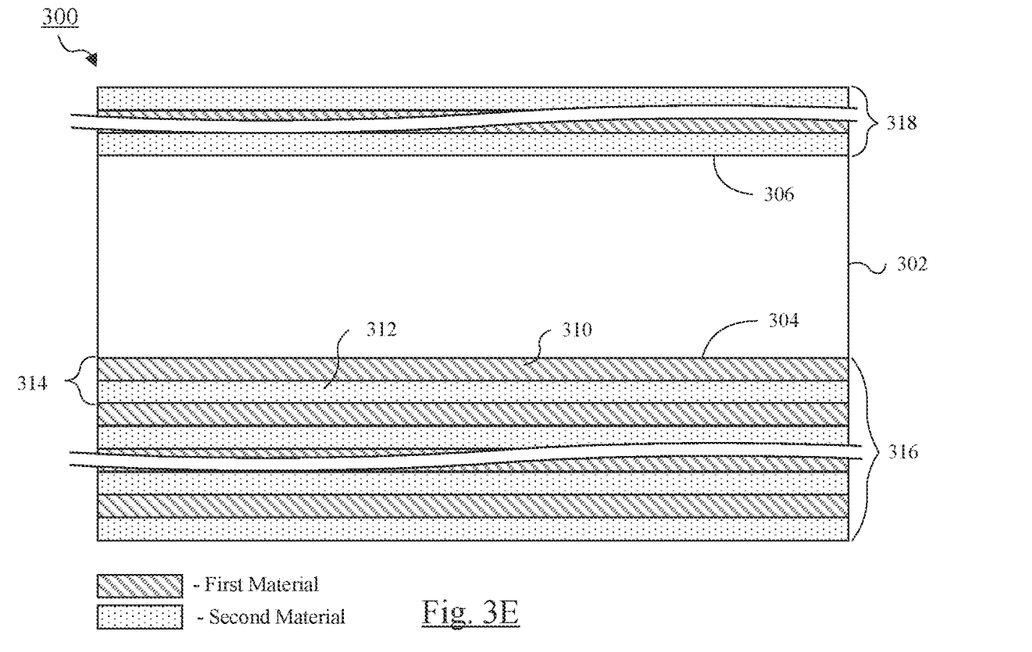

FIG. 3E depicts interference filter 300 with an anti-reflective structure 318 formed over back surface 306. Anti-reflective structure 318 may improve the transmittance of interference filter 300. Anti-reflective structure 318 includes a plurality of alternating material layers, similar to the alternating layers (first material layer 310, then second material layer 312) used to form the bandpass filter 316 over front surface 304. Like bandpass filter 316, anti-reflective structure 318 includes a plurality of alternating material layers that alternate between a relatively high refractive index layer and a relatively low refractive index layer. As depicted in FIG. 3E, anti-reflective structure 318 includes a first anti-reflective layer formed from a relatively high refractive index material, and a second anti-reflective layer formed thereover from a relatively low refractive index material. In accord with the example provided above, the first anti-reflective layer is formed from $MgF_2$ and the second anti-reflective layer is formed from $TiO_2$. The alternating material layers of anti-reflective structure 318 may be formed by the same process as is used to form the first material layer 310 and second material layer 312 and the additional material layers formed of thereover. In the depicted embodiment, the alternating material layers of anti-reflective structure 318 are amorphous material layers formed using an ion beam assisted deposition technique using a high bias voltage.

Expressly depicted in FIG. 3E are three layers in anti-reflective structure 318. More than three layers are impliedly depicted. For example, some embodiments of interference filter 300 include five alternating material layers in anti-reflective structure 318. Anti-reflective structure 318 may include from about three to more than eight alternating material layers. In some embodiments, anti-reflective structure 318 includes an even number of alternating material layers, while in other embodiments it contains an odd number of alternating material layers. Additionally, while in some embodiments the material layer of anti-reflective structure 318 that is closest to substrate 302 is made from a relatively high refractive index material, in other embodiments the material layer of anti-reflective structure 316 closest to substrate 302 is made from a relatively low refractive index material.

Figure 4:
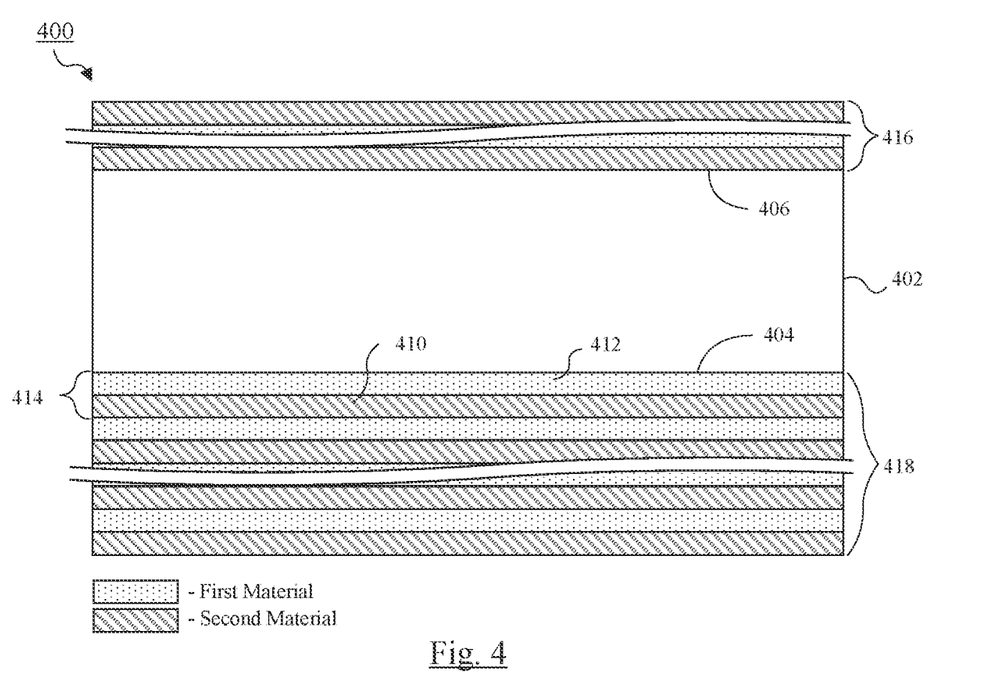
FIG. 4 is a fragmentary cross-sectional view of an interference filter according to an alternative embodiment of the present disclosure.

FIG. 4 depicts an interference filter 400 that may be understood as an alternative or additional embodiment of interference filter 300 and useful as interference filter 110 of lithography system 100 of FIG. 1. Interference filter 400 includes a transparent substrate 402, which has a front side 404 and a back side 406. A plurality of alternating material layers is deposited on front surface 404 to form a bandpass filter 416, which is similar to bandpass filter 316 as depicted in FIGS. 3D and 3E. Bandpass filter 416 includes a plurality of pairs of alternating material layers, like pair of layers 414. A pair of layers 414 includes a first material layer 410 which is closest to the front surface 404 of substrate 402. In the depicted embodiment first material layer 410 is formed from a relatively high refractive index material. A second material layer 412 is deposited over the first material layer 410 and is formed from a relatively low refractive index material. Thus in contrast with interference filter 400 of FIGS. 3D and 3E, which had alternating material layers arranged in a low-high-low-high pattern beginning over the front surface 404 of substrate 402, interference filter 400 has alternating material layers arranged in a high-low-high-low pattern to form bandpass filter 408.

In the depicted embodiment of interference filter 400, first material layer 420 is formed from $Ta_2O_5$, which has a refractive index of 2.2. For a desired central wavelength of 370 nm, first material layer 410 is about 41.48 nm thick. Second material layer 412 is formed from $SiO_2$, which has a refractive index of 1.47. Thus, for the desired central wavelength of 370 nm, second material layer 414 is about 62.07 nm thick.

An anti-reflective structure 418 is formed over back surface 406. Like bandpass filter 416, anti-reflective structure 418 includes a plurality of alternating material layers. Unlike anti-reflective structure 318 of FIGS. 3D and 3E, which had a high-low-high-low pattern moving away from substrate 302, anti-reflective structure 418 has a low-high-low-high pattern. In the depicted embodiment, anti-reflective structure 418 includes the same materials used to form bandpass filter 416. Thus the first of the alternating material layers of anti-reflective structure 418 is formed from $SiO_2$, and the layer formed thereover is formed from $Ta_2O_5$. In some embodiments, bandpass filter 416 may be formed from alternating layers of a first and a second material, while anti-reflective structure 418 is formed from alternating layers of a third and a fourth material. In the depicted embodiment, the layer of bandpass filter 416 and the layer of anti-reflective structure 418 that are closest to substrate 402 are opposite, i.e. one is a relatively high refractive index material while the other is a relatively low refractive index material. In some embodiments, both bandpass filter 416 and anti-reflective structure 418 include the same material in the layer of each that is closest to substrate 402.

Figure 5:
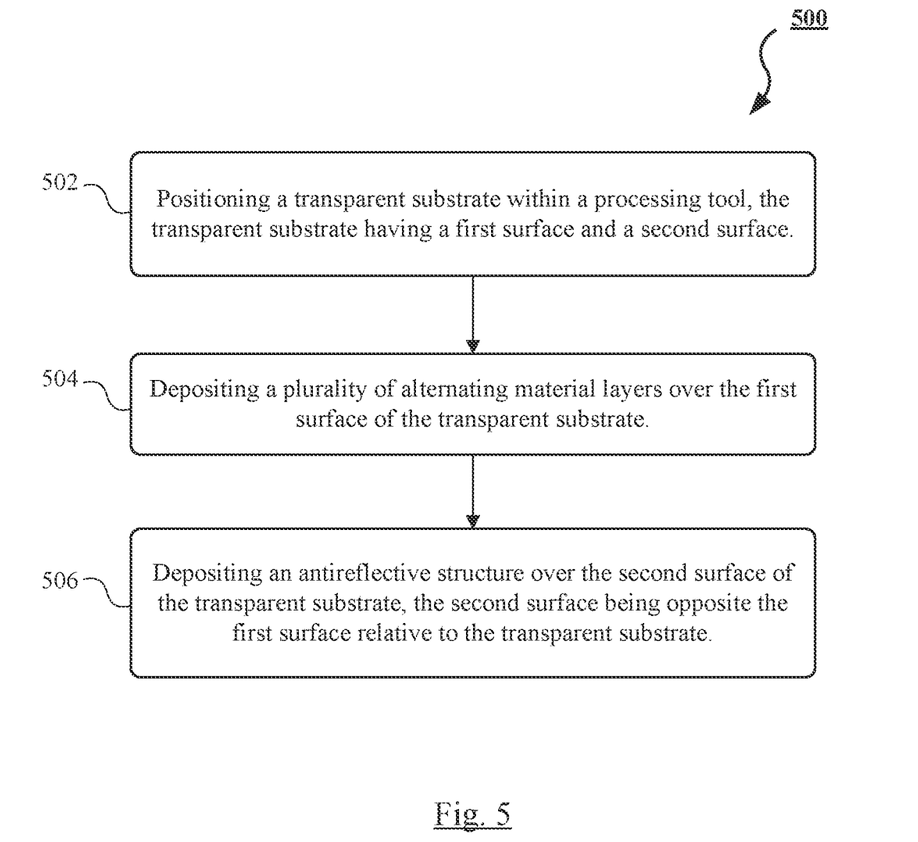
FIG. 5 is a flowchart of a method for fabrication an interference filter according to an embodiment of the present disclosure.

FIG. 5 is a flowchart of a method 500 for fabricating an interference filter. As depicted, method 500 includes a plurality of steps. Many embodiments of method 500 may be apparent to one of skill in the art that have additional steps before and/or after any or all of the depicted steps. Such embodiments are within the scope of this disclosure. Method 500 may begin in step 502 when a transparent substrate with a first surface and a second surface is positioned within a processing system. In step 504, the processing system is used to deposit a plurality of alternating material layers over the first surface of the transparent substrate. In step 506, the same processing system or a different processing system is used to deposit an anti-reflective structure over the second surface of the transparent substrate. The second surface is opposite the first surface relative to the transparent substrate. For example, the first surface may be a front surface while the second surface is a back surface of the transparent substrate.

For clarity of explanation, reference is made to FIGS. 3A, 3B, 3C, 3D, and 3E, and the corresponding descriptions above to more clearly explain method 500. In performing method 500, a desired wavelength to be passed by an interference filter, like interference filter 500, may be determined or selected. For example, the desired wavelength, which is the central wavelength of interference filters 110, 300, and 400, maybe about 370 nm. The substrate 302 is positioned with a deposition chamber (step 502). A first material layer 310 is deposited over the front surface 304 of substrate 302. The first material layer 310 may have a relatively low refractive index, and may be deposited as an amorphous layer by ion beam assisted deposition. The second material layer 312 having a relatively high refractive index, is deposited over the first material layer 310. After the high refractive index material layer is deposited, another low refractive index material layer is deposited until there are about 30 alternating material layers in a low-high-low-high pattern (step 504) to form a bandpass filter 316.

Depositing the anti-reflective structure 318 over the second surface of the transparent substrate includes depositing a plurality of alternating material layers, wherein the materials alternate from a relatively high refractive index material layer to a relatively low refractive index material layer or from a relatively low refractive index material layer to a relatively high refractive index material layer (step 506).

One embodiment of the invention is an optical component such as an interference filter. The interference filter includes a transparent substrate having a front surface and a back surface. A plurality of alternating material layers are formed over the front surface of the transparent substrate, with an anti-reflective structure formed over the back surface of the transparent substrate. In some embodiments, the plurality of alternating material layers includes a plurality of pairs of alternating material layers, with each pair of alternating material layers including a first material layer and a second material layer. The first material layer has a higher refractive index than the second material layer.

Each of the plurality of alternating material layers has a refractive index and a thickness. And the refractive index and thickness of each material layer are determined by the wavelength of light to be passed by the interference filter. Embodiments of the interference filter include about 20 about 40 material layers in the plurality of alternating material layers. In at least some embodiments, each of the plurality of alternating material layers has a refractive index and a thickness, and a quarter of a center wavelength of the interference filter is equal to the refractive index multiplied by the thickness of each of the plurality of alternating material layers.

The plurality of alternating material layers is formed by ion beam assisted deposition in some embodiments, and are each an amorphous film layer. The alternating material layers in the interference filter are formed from two of $MgF_2$, $TiO_2$, $Al_2O_3$, $Ta_2O_5$, and $SiO_2$. In some embodiments, other materials are selected. The plurality of alternating material layers has an even number of material layers and the anti-reflective structure has an odd number of material layers, in some embodiments. Further, in some embodiments the plurality of alternating material layers has layers of a first material and layers of a second material, and the anti-reflective structure comprises a plurality of layers of the same first material and the same second material.

Another embodiment is a lithography system that includes a light source with a plurality of spectrum peaks in the light it emits, a plurality of lenses, at least one mirror and a plurality of filters including an interference filter. The interference filter has a plurality of alternating material layers deposited on a substrate, and allows one of the plurality of spectrum peaks to pass, while blocking the rest of the plurality of spectrum peaks. In some related embodiments, the plurality of alternating material layers of the interference filter includes layers of a first material and layers of a second material, where the first material has a higher refractive index than that of the second material. Each of the plurality of material layers is an amorphous film layer.

In some embodiments, interference filter in the lithography system further includes an anti-reflective structure deposited on the substrate. The anti-reflective structure and the plurality of alternating material layers are deposited on opposite sides of the substrate. In the interference filter, each of the plurality of alternating material layers has a thickness corresponding to a quarter wavelength of a desired center wavelength.

Another embodiment is a method for fabricating an interference filter. Embodiments of the method include steps of positioning a transparent substrate having a first surface and a second surface in a processing tool, depositing a plurality of alternating material layers over the first surface of the transparent substrate, and depositing an anti-reflective structure over the second surface of the transparent substrate. The second surface is opposite the first surface relative to the transparent substrate. Some embodiments of the method further include a step of determining a desired center wavelength to be passed by the interference filter. Depositing the plurality of alternating material layers includes depositing a first material having a low refractive index and depositing a second material having a high refractive index.

In some related embodiments, depositing the anti-reflective structure includes depositing a plurality of material layers that alternate between a first material and a second material. Depositing the plurality of alternating material layers over the first surface includes depositing a plurality of amorphous material layers.

What is claimed is:

1. A method for fabricating a semiconductor device, the method comprising:
    providing a wafer that is to undergo one or more processing steps;
    forming a photoresist layer on the wafer; and
    providing the wafer to a lithography system and performing a patterning process on the wafer, the lithography system having an interference filter that includes:
        a transparent substrate having a first surface and a second surface,
        a first material layer stack formed over the first surface of the transparent substrate, wherein the first material layer stack includes first metal-containing material layers having a first refractive index (FRI) and second metal-containing material layers having a second refractive index (SRI), wherein the FRI is different than the SRI and the first metal-containing material layers and the second metal-containing material layers alternate in the first material layer stack, such that the first material layer stack has an FRI-SRI-FRI-SRI pattern, and
        a second material layer stack formed over the second surface of the transparent substrate, wherein the second material layer stack includes third metal-containing material layers having a third refractive index (TRI) and fourth metal-containing material layers having a fourth refractive index (FRRI), wherein the TRI is different than the FRRI and the third metal-containing material layers and the fourth metal-containing material layers alternate in the second material layer stack, such that the second material layer stack has a TRI-FRRI-TRI-FRRI pattern.

2. The method of claim 1, wherein the FRI is greater than the SRI and the TRI is less than the FRRI, such that the FRI-SRI-FRI-SRI pattern is a high-low-high-low refractive index pattern and the TRI-FRRI-TRI-FRRI pattern is a low-high-low-high refractive index pattern.

3. The method of claim 1, wherein the FRI is less than the SRI and the TRI is greater than the FRRI, such that the FRI-SRI-FRI-SRI pattern is a low-high-low-high refractive index pattern and the TRI-FRRI-TRI-FRRI pattern is a high-low-high-low refractive index pattern.

4. The method of claim 1, wherein the FRI and the FRRI are the same and the SRI and the TRI are the same.

5. The method of claim 1, wherein the first metal-containing material layers and the fourth metal-containing material layers are TiO$_2$ layers and the second metal-containing material layers and the third metal-containing material layers are MgF$_2$ layers.

6. The method of claim 1, wherein:
the first metal-containing material layers and the second metal-containing material layers are amorphous metal-containing material layers;
a first one of the first metal-containing material layers physically contacts the first surface of the transparent substrate;
a first one of the second metal-containing material layers physically contacts the first one of the first metal-containing material layers; and
another one of the first metal-containing material layers is disposed over the first one of the second metal-containing material layers and further away from the first surface of the transparent substrate than any other material layers of the first material layer stack, wherein the first one of the first metal-containing material layers and the another one of the first metal-containing material layers have a same thickness measured in a direction perpendicular to the first surface of the transparent substrate.

7. The method of claim 1-6, wherein each of the first metal-containing material layers have a first thickness, each of the second metal-containing material layers have a second thickness, and the first thickness is different than the second thickness.

8. A method for fabricating a semiconductor device, the method comprising:
providing a wafer for a lithography system, wherein the lithography system includes an interference filter that includes:
a transparent substrate having a first surface and a second surface,
a first material layer stack having an odd number of alternating amorphous material layers formed over the first surface of the transparent substrate, wherein:
a sequence of the amorphous material layers alternates between a first refractive index and a second refractive index;
the amorphous material layers include a first amorphous material layer that physically contacts the first surface of the transparent substrate, a second amorphous material layer over the first amorphous material layer, and a fifth amorphous material layer further away from the first surface of the transparent substrate than any other material layers of the first material layer stack, wherein the first amorphous material layer and the fifth amorphous material layer have a same thickness measured in a direction perpendicular to the first surface of the transparent substrate; and
the first amorphous material layer has the first refractive index, the second amorphous material layer has the second refractive index, and the first refractive index is higher than the second refractive index, and
a second material layer stack having an even number of alternating material layers formed over the second surface of the transparent substrate; and
performing a patterning process on the wafer with the lithography system.

9. The method of claim 8, wherein the first amorphous material layer is formed of Ta$_2$O$_5$ and the second amorphous material layer is formed of SiO$_2$.

10. The method of claim 8, wherein the second material layer stack comprises:
a third amorphous material layer that physically contacts the second surface of the transparent substrate, the third amorphous material layer having the second refractive index;
a fourth amorphous material layer disposed over the third amorphous material layer, wherein the third amorphous material layer has a lower refractive index than the fourth amorphous material layer; and
a sixth amorphous material layer positioned further away from the second surface of the transparent substrate than any other amorphous material layer of the second plurality of material layer stack.

11. The method of claim 8, wherein the first material layer stack is configured so that a desired center wavelength is passed by the interference filter.

12. The method of claim 8, wherein the first material layer stack is configured to pass a desired wavelength of light by depositing the first material layer stack at a thickness determined by the desired wavelength.

13. The method of claim 8, wherein the second material layer stack includes from about 20 to about 50 material layers.

14. The method of claim 8, wherein each layer of the first material layer stack and the second material layer stack has a respective refractive index and a respective thickness, and wherein a quarter of a center wavelength of the interference filter is equal to the respective refractive index times the respective thickness.

15. The method of claim 8, wherein the first amorphous material layer is formed of TiO$_2$ and the second amorphous material layer is formed of MgF$_2$.

16. A method for fabricating a semiconductor device, the method comprising:
providing a wafer that is to undergo one or more processing steps;
forming a photoresist layer on the wafer;
providing the wafer to a lithography system, the lithography system having an interference filter that includes:
a transparent substrate having a first surface and a second surface,
a first plurality of an odd number of alternating material layers formed over the first surface of the transparent substrate, the first plurality of the odd number of the alternating material layers comprising:
a first amorphous material layer that physically contacts the first surface of the transparent substrate;
a second amorphous material layer, wherein the first amorphous material layer has a higher refractive index than the second amorphous material layer; and
a fifth amorphous material layer further away from the first surface of the transparent substrate than any other material layers of the first plurality of the odd number of the alternating material layers, wherein the first amorphous material layer and the fifth amorphous material layer have a same thickness measured in a direction perpendicular to the first surface of the transparent substrate, and
a second plurality of an odd number of alternating material layers formed over the second surface of the transparent substrate, the second plurality of the odd number of the alternating material layers comprising:
a third amorphous material layer that physically contacts the second surface of the transparent substrate, the third amorphous material layer having the same refractive index as the second amorphous material layer;
a fourth amorphous material layer disposed over the third amorphous material layer, wherein the third amorphous material layer has a lower refractive index than the fourth amorphous material layer; and
a sixth amorphous material layer positioned further away from the second surface of the transparent substrate than any other material layers of the second plurality of the odd number of the alternating material layers, the first amorphous material layer having the same refractive index as the fourth, fifth, and sixth amorphous material layers, and performing a patterning process on the wafer.

17. The method of claim 16, wherein the second plurality of the odd number of the alternating material layers includes from about 20 to about 50 material layers.

18. The method of claim 16, wherein each layer of the first plurality of the odd number of the alternating material layers and the second plurality of the odd number of the alternating material layers has a respective refractive index and a respective thickness, and wherein a quarter of a center wavelength of the interference filter is equal to the respective refractive index times the respective thickness of each layer.

19. The method of claim 16, further comprising forming one or more layers of the first plurality of the odd number of the alternating material layers and the second plurality of the odd number of the alternating material layers by ion beam assisted deposition.

20. The method of claim 16, wherein the first amorphous material layer is formed of $MgF_2$ and the second amorphous material layer is formed of $TiO_2$.

* * * * *